United States Patent
Wu et al.

(10) Patent No.: US 9,911,672 B1
(45) Date of Patent: Mar. 6, 2018

(54) SEMICONDUCTOR DEVICES, METHOD FOR FABRICATING INTEGRATED FAN-OUT PACKAGES, AND METHOD FOR FABRICATING SEMICONDUCTOR DEVICES

(71) Applicant: Taiwan Semiconductor Manufacturing Co., Ltd., Hsinchu (TW)

(72) Inventors: Chi-Hsi Wu, Hsinchu (TW); Der-Chyang Yeh, Hsin-Chu (TW); Hsien-Wei Chen, Hsinchu (TW); Li-Hsien Huang, Hsinchu County (TW); Kuan-Chung Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/281,086

(22) Filed: Sep. 30, 2016

(51) Int. Cl.
*H01L 21/66* (2006.01)
*H01L 21/48* (2006.01)
(Continued)

(52) U.S. Cl.
CPC ............ *H01L 22/32* (2013.01); *H01L 21/486* (2013.01); *H01L 21/56* (2013.01); *H01L 21/78* (2013.01); *H01L 22/14* (2013.01); *H01L 23/3128* (2013.01); *H01L 23/49816* (2013.01); *H01L 23/49822* (2013.01); *H01L 23/49827* (2013.01); *H01L 23/49838* (2013.01); *H01L 25/0657* (2013.01); *H01L 25/105* (2013.01);
(Continued)

(58) Field of Classification Search
CPC ....... H01L 22/32; H01L 21/486; H01L 22/14; H01L 21/56; H01L 21/78; H01L 23/49838; H01L 23/3128; H01L 25/0657; H01L 23/49822; H01L 23/49816; H01L 25/105; H01L 23/49827; H01L 2225/06568; H01L 2225/0651
See application file for complete search history.

(56) References Cited

U.S. PATENT DOCUMENTS 8,361,842 B2    1/2013    Yu et al.
8,680,647 B2    3/2014    Yu et al.
(Continued)

*Primary Examiner* — Kyoung Lee
(74) *Attorney, Agent, or Firm* — JCIPRNET

(57) ABSTRACT

A semiconductor device including an integrated circuit, a plurality of conductive pillars, and a protection layer is provided. The integrated circuit includes a semiconductor substrate and an interconnection structure covering the semiconductor substrate, wherein the interconnection structure includes a plurality of patterned conductive layers and a plurality of inter-dielectric layers stacked alternately, the topmost patterned conductive layer of the patterned conductive layers is covered by the topmost inter-dielectric layer of the inter-dielectric layers, and the topmost patterned conductive layer is exposed by a plurality of openings of the topmost inter-dielectric layer. The conductive pillars are disposed on the topmost patterned conductive layer exposed by the openings, and the conductive pillars are electrically connected to the topmost patterned conductive layer through the openings. The protection layer covers the integrated circuit and the conductive pillars. A method for fabricating the semiconductor device and a method for fabricating integrated fan-out packages including the semiconductor device are also provided.

17 Claims, 22 Drawing Sheets

(51) Int. Cl.
　　*H01L 21/56*　　(2006.01)
　　*H01L 21/78*　　(2006.01)
　　*H01L 23/498*　　(2006.01)
　　*H01L 23/31*　　(2006.01)
　　*H01L 25/10*　　(2006.01)
　　*H01L 25/065*　　(2006.01)
(52) U.S. Cl.
　　CPC ............... *H01L 2225/0651* (2013.01); *H01L 2225/06568* (2013.01); *H01L 2225/1058* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2007/0164440 A1* | 7/2007 | Matsuda | B23D 61/028 257/762 |
| 2011/0291288 A1 | 12/2011 | Wu et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2016/0118333 A1* | 4/2016 | Lin | H01L 25/50 257/773 |

* cited by examiner

US 9,911,672 B1

SEMICONDUCTOR DEVICES, METHOD FOR FABRICATING INTEGRATED FAN-OUT PACKAGES, AND METHOD FOR FABRICATING SEMICONDUCTOR DEVICES

BACKGROUND

The semiconductor industry has experienced rapid growth due to continuous improvements in the integration density of various electronic components (i.e., transistors, diodes, resistors, capacitors, etc.). For the most part, this improvement in integration density has come from gradual reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

The integrated fan-out packages are powerful solutions for heterogeneous integration between chips and system. The improved routability and reliability provided by the integrated fan-out packages are key factors for future packages. How to simplify the fabricating process of the integrated fan-out packages is an important issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
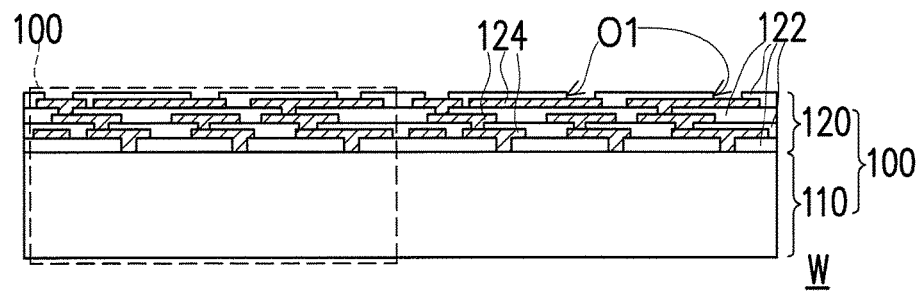
FIGS. 1 through 5 schematically illustrate a process flow for fabricating semiconductor devices in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 5 schematically illustrate a process flow for fabricating semiconductor devices in accordance with some embodiments of the present disclosure. Referring to FIG. 1, a wafer W including a plurality of integrated circuits 100 arranged in an array is provided. Before a wafer sawing or dicing process is performed on the wafer W, the integrated circuits 100 of the wafer W are connected one another, as shown in FIG. 1. In some embodiments, each of the integrated circuits 100 includes a semiconductor substrate 110 and an interconnection structure 120 disposed on the semiconductor substrate 110. The semiconductor substrate 110 may be a silicon substrate including active components (e.g., transistors or the like) and passive components (e.g., resistors, capacitors, inductors or the like) formed therein. The interconnection structure 120 may include a plurality of inter-dielectric layers 122 and a plurality of patterned conductive layers 124 stacked alternately. For example, the inter-dielectric layers 122 may be silicon oxide layers, silicon nitride layers, silicon oxy-nitride layers, or dielectric layers formed by other suitable dielectric materials, and the patterned conductive layers 124 may be patterned copper layers or other suitable patterned metal layers.

The topmost patterned conductive layer 124 is covered by the topmost inter-dielectric layer 122 of the inter-dielectric layers 120, and the topmost patterned conductive layer 124 is exposed by a plurality of openings O1 of the topmost inter-dielectric layer 124.

Figure 2:
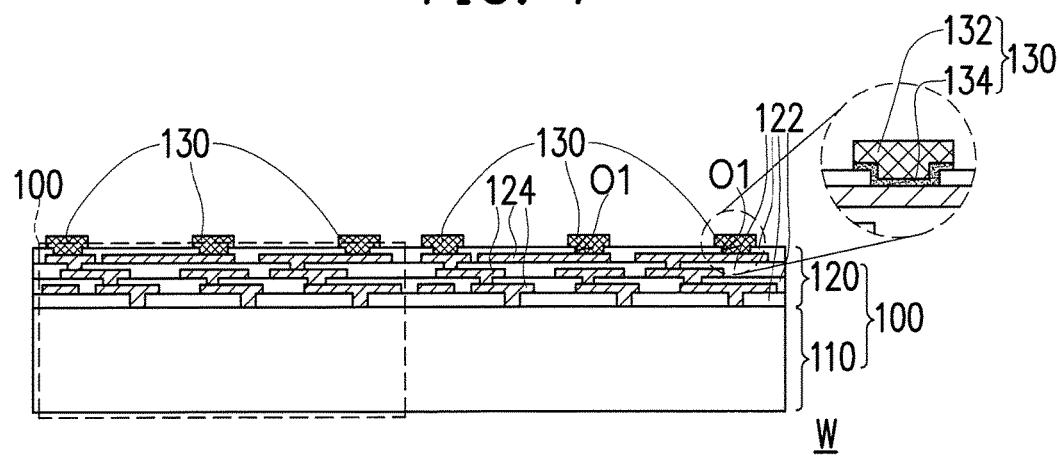

Referring to FIG. 2, a plurality of conductive pillars 130 are formed on the wafer W, the conductive pillars 130 may be formed through a plating process. In some embodiments, a seed layer (e.g., Ti/Cu seed layer) may be sputtered on the wafer W first, and then a patterned photoresist is formed on the seed layer. The wafer W having the seed layer and the patterned photoresist thereon is immersed into a plating bath such that the conductive pillars 130 are plated onto part area of the seed layer that is exposed by the patterned photoresist. The conductive pillars 130 are corresponding to the openings of the topmost inter-dielectric layer 122. After the conductive pillars 130 are plated onto the exposed seed layer, the patterned photoresist is removed. Thereafter, the seed layer is patterned by using the conductive pillars 130 as a hard mask. In some embodiments, the conductive pillars 130 may be copper pillars or other suitable metallic pillars.

As shown in FIG. 2, the conductive pillars 130 may include a pillar portion 132 and a seed pattern 134 between the pillar portion 132 and the topmost patterned conductive layer 124. In some embodiments, the material of at least part (e.g., the pillar portions 132) of the conductive pillars 130 and that of the topmost patterned conductive layer 124 are substantially the same. The seed patterns 134 of the conductive pillars 130 are in contact with the pillar portion 132 and the topmost patterned conductive layer 124. Through properly selecting of the materials of the seed pattern 134 and the topmost patterned conductive layer 124, the adhesion between the conductive pillars 130 (e.g., the seed pattern 134) and the topmost patterned conductive layer 124 may be enhanced. In the present embodiment, no additional probing pad or sacrificial pad (e.g., aluminum pad) for chip-probing process is formed between the seed patterns 134 and the topmost patterned conductive layer 124, and the conductive pillars 130 are in contact with the topmost patterned conductive layer 124 of the interconnection structure 120 directly. In other words, no chip-probing process is required to be performed before the formation of the conductive pillars 130. The copper pillar portion 132 and the Ti/Cu seed pattern 134 have good resistance on electromigration and have low resistivity, and the interfaces between the topmost patterned conductive layer 124 (e.g. copper layer) and the Ti/Cu seed patterns 134 may induce less equivalent series inductance (ESL) and/or equivalent series resistance (ESR).

As shown in FIG. 2, the omission of the probing pad or sacrificial pad (e.g., aluminum pad) simplifies the fabrication process and is helpful to reduce the fabrication costs and improve the throughput. Accordingly, additional chip-probing process to be performed on the probing pad or sacrificial pad (e.g., aluminum pad) is thus omitted. Instead of two individual chip probing processes performed on conventional wafer, the chip probing process is merely performed once in the present embodiment, and the chip probing process is performed after the formation of the conductive pillars 130. Furthermore, the omission of the probing pad or sacrificial pad (e.g., aluminum pad) enables the topmost patterned conductive layer 124 being in contact with the seed patterns 134 of the conductive pillars 130 directly, and through properly selecting of the materials of the seed pattern 134 and the topmost patterned conductive layer 124, the resistivity generated between the topmost patterned conductive layer 124 and the seed patterns 134 may be lowered.

To sum up, the omission of the probing pad or sacrificial pad (e.g., aluminum pad) not only enhances the adhesion between the conductive pillars 130 (e.g., the seed pattern 134) and the topmost patterned conductive layer 124, but also lowers the resistivity generated between the topmost patterned conductive layer 124 and the seed patterns 134. Accordingly, forming the conductive pillars 130 directly on the topmost patterned conductive layer 124 facilitates improvements on throughput, fabrication costs, reliability, and electrical characteristics of the semiconductor devices.

Figure 3:
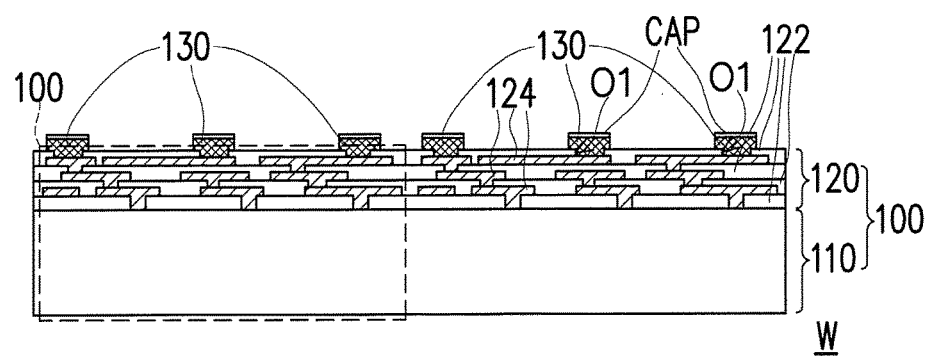
Figure 8:
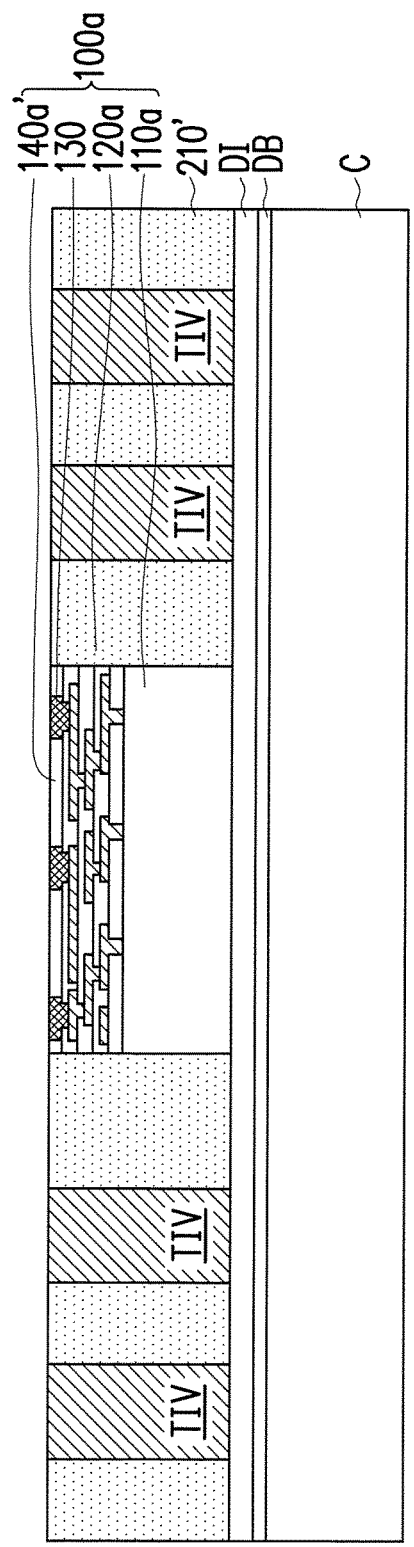
Figure 24:
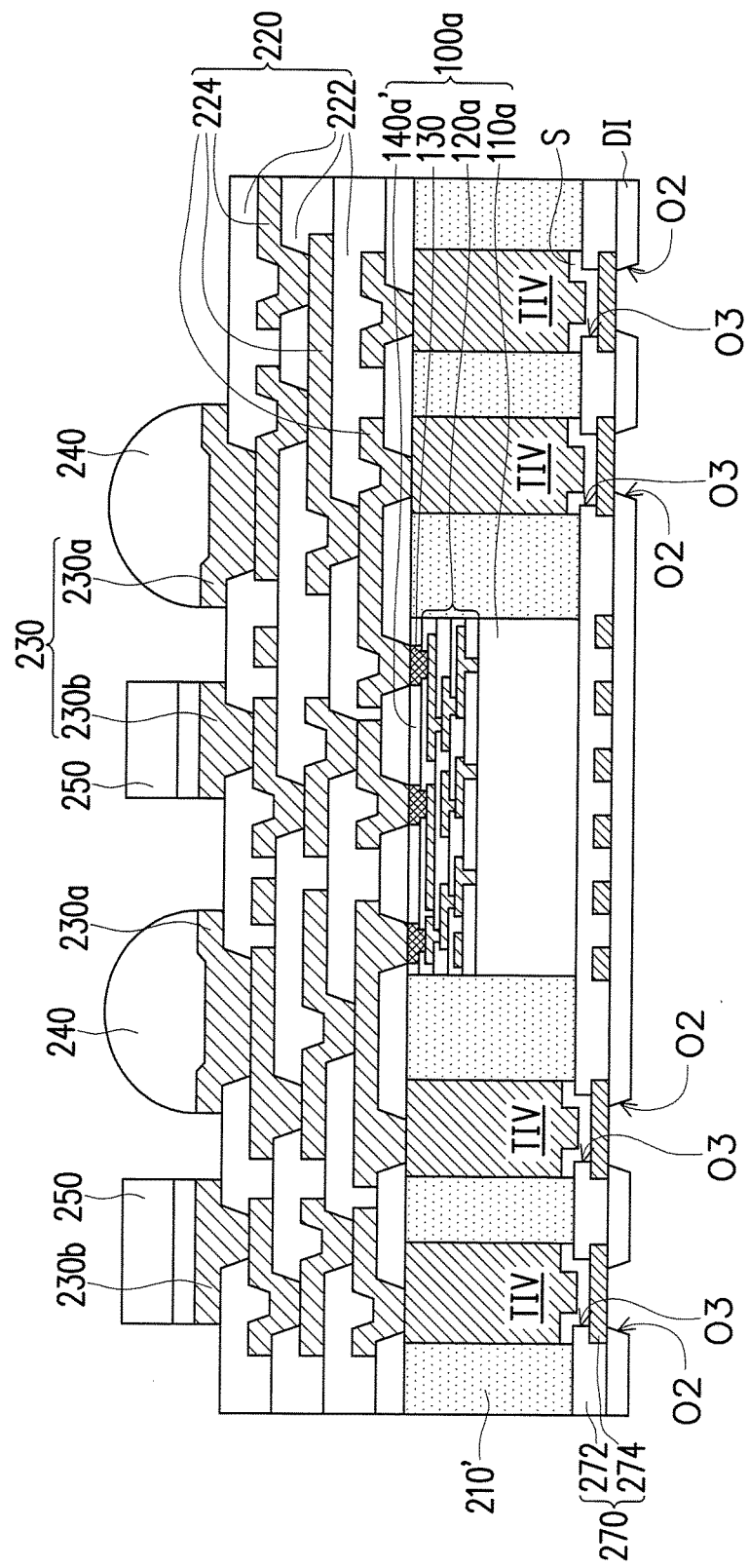
Figure 25:
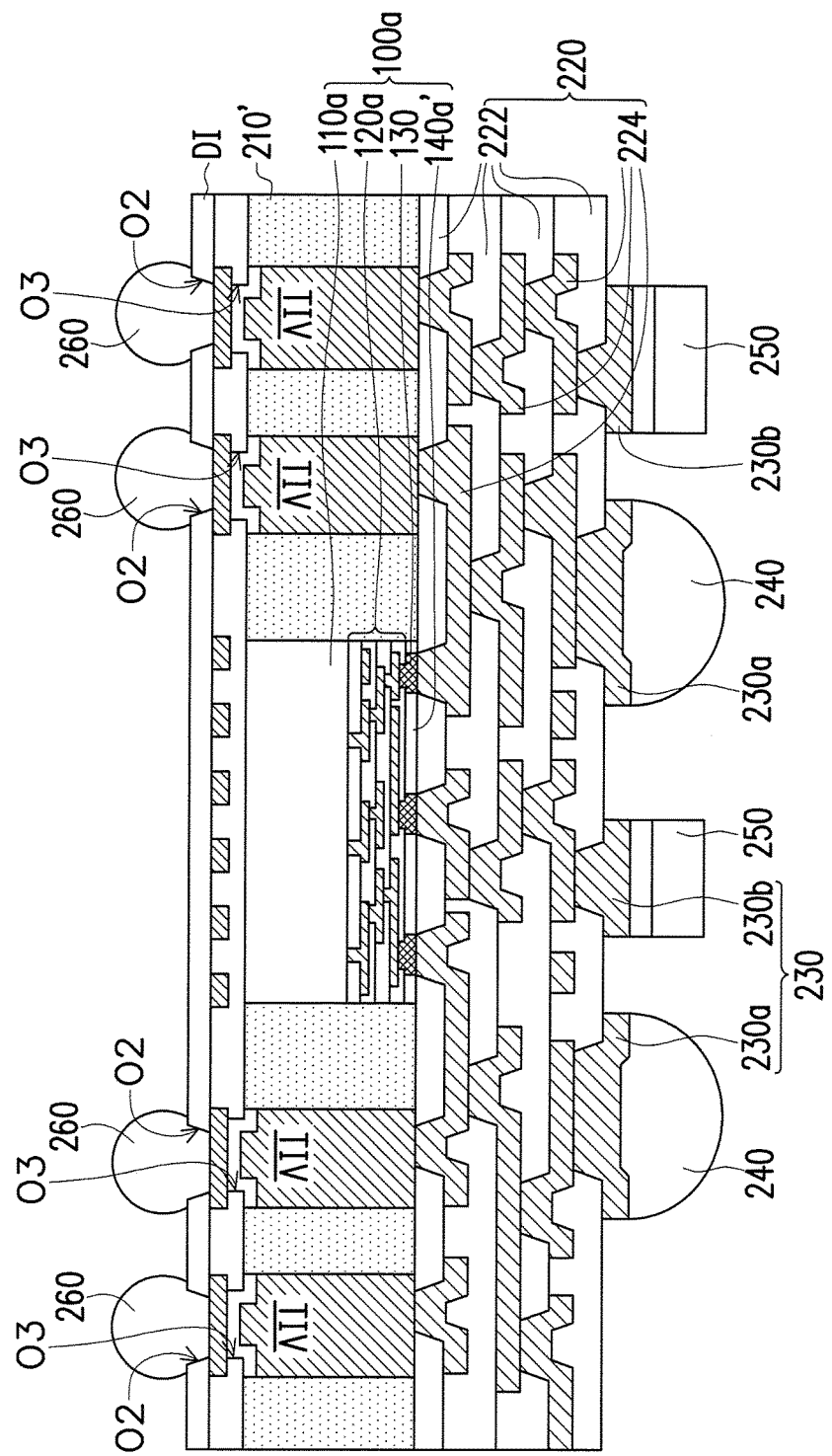

Referring to FIG. 3, in order to inspect the electrical characteristics of the conductive pillars 130 and/or the integrated circuits 100, a plurality of conductive caps CAP are formed on top surfaces of the conductive pillars 130. In some embodiments, the conductive caps CAP may be solder caps. For example, the above-mentioned solder caps may be lead-free solder caps. Then, a chip-probing process is performed on the conductive caps CAP so as to inspect the electrical characteristics of the conductive pillars 130 and/or the integrated circuits 100. During the chip-probing process, the inspection probes are pressed onto the conductive caps CAP and the probing marks are thus formed on the top surfaces of the conductive caps CAP. However, the probing marks formed on the top surfaces of the conductive caps CAP may not deteriorate the reliability of the conductive pillars 130 and the integrated circuits 100 because the conductive caps CAP will be removed, as shown in FIG. 8 and FIG. 24.

Figure 4:
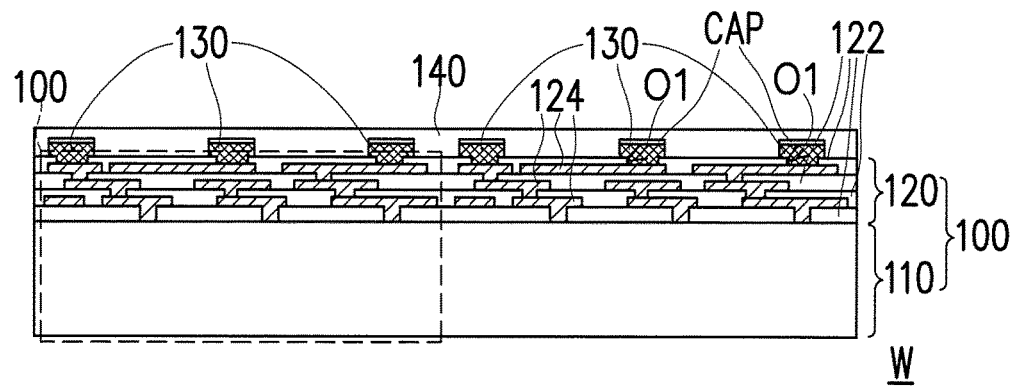

Referring to FIG. 4, a protection layer 140 is formed over the wafer W such that the conductive caps CAP and the conductive pillars 130 are covered or encapsulated by the protection layer 140. The conductive caps CAP and the conductive pillars 130 are protected by the protection layer 140. In some embodiments, the protection layer 140 may be a polyimide (PI) layer, a polybenzoxazole (PBO) layer, or other suitable polymer (or organic) layer. After the protection layer 140 is formed, a back side grinding process of the wafer W may be optionally performed such that the wafer W is thinned to have a predetermined thickness. During the back side grinding process of the wafer W, the conductive pillars 130 are protected by the protection layer 140a from damage.

As shown in FIG. 3 and FIG. 4, since there is no additional probing pad or sacrificial pad (e.g., aluminum pad) for chip-probing process is required, the fabrication costs and thermal budge of the semiconductor devices are lowered, and the throughput of the semiconductor devices is improved. Furthermore, the chip-probing process (shown in FIG. 3) is required to be performed one time before the formation of the protection layer 140.

Figure 5:
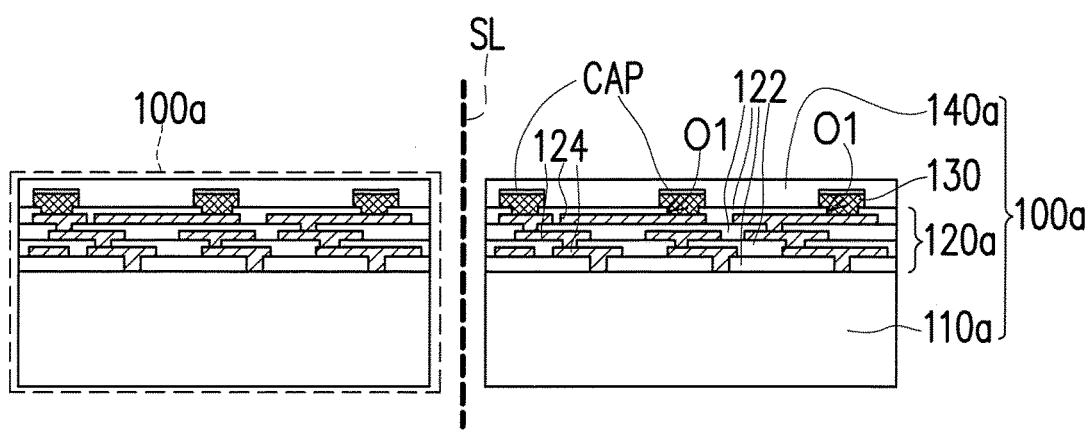

Referring to FIG. 5, after the wafer W including the conductive pillars 130 and the conductive caps CAP formed thereon is inspected, a wafer dicing process or a wafer singulation process is performed along the scribe line SL such that the wafer W is singulated into a plurality of semiconductor devices 100a. Each one of the singulated semiconductor devices 100a includes a semiconductor substrate 110a, an interconnection structure 120a disposed on the semiconductor substrate 110a, the conductive pillars 130, and a protection layer 140a. The protection layer 140a covers the interconnection structure 120a. The conductive pillars 130 are encapsulated by the protection layer 140a. During the wafer dicing process, the conductive pillars 130 are protected by the protection layer 140a from damage.

FIG. 6 through FIG. 13 schematically illustrate a process flow for fabricating an integrated fan-out package in accordance with some embodiments of the present disclosure.

Figure 6:
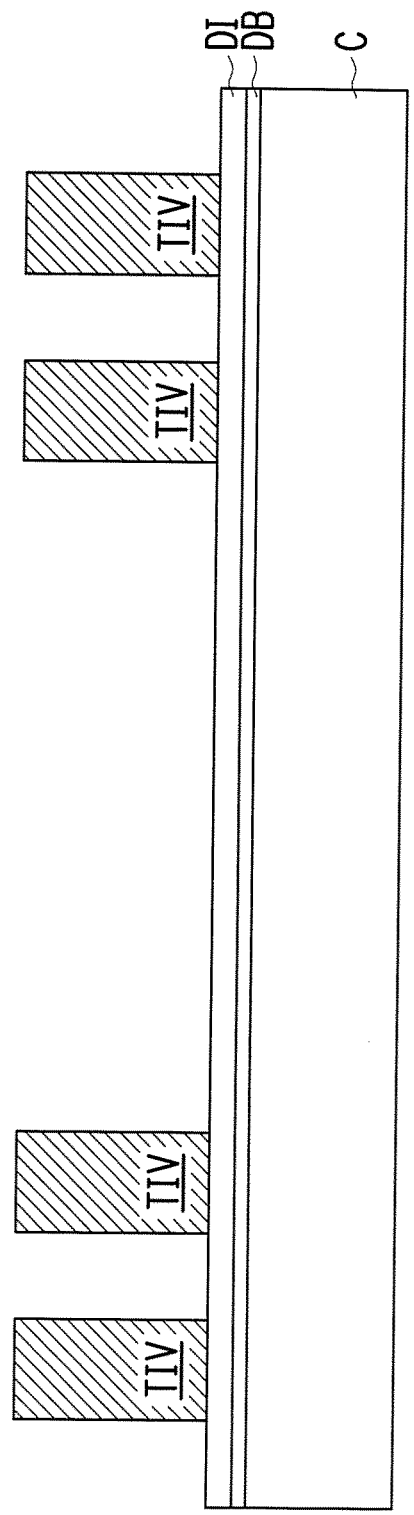
FIG. 6 through FIG. 13 schematically illustrate a process flow for fabricating an integrated fan-out package in accordance with some embodiments of the present disclosure.

Referring to FIG. 6, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example. In alternative embodiments, the de-bonding layer DB may be a photo-curable release film whose stickiness is decreased by a photo-curing process or a thermal curable release film whose stickiness is decreased by a thermal-curing process, and the first dielectric layer DI may be made of other photosensitive or non-photosensitive dielectric materials. After the carrier C having the de-bonding layer DB and the dielectric layer DI formed thereon is provided, a plurality of conductive through insulator vias TIV are formed on the dielectric layer DI. In some embodiments, the plurality of conductive through insulator vias TIV is formed by photoresist coating, photolithography, plating, and photoresist stripping process. For example, the conductive through insulator vias TIV include copper posts or other suitable metal posts.

As shown in FIG. 6, in some embodiments, at least one of the singulated semiconductor device 100a including the conductive pillars 130 distributed thereon is picked and placed on the dielectric layer DI. The semiconductor device 100a is attached or adhered on the dielectric layer DI through a die attachment film (DAF), an adhesion paste or the like. In some alternative embodiments, two or more semiconductor devices 100a are picked and placed on the dielectric layer DI, and the semiconductor devices 100a placed on the dielectric layer DI may be arranged in an array. When the semiconductor devices 100a placed on the dielectric layer DI are arranged in an array, the conductive through insulator vias TIV may be classified into groups, and each of the semiconductor devices 100a is corresponding to and is surrounded by one group of the through insulator vias TIV, respectively. The number of the semiconductor devices 100a is corresponding to the number of the groups of the conductive through insulator vias TIV.

As shown in FIG. 6, the semiconductor device 100a is picked and placed on the dielectric layer DI after the formation of the conductive through insulator vias TIV. However, the disclosure is not limited thereto. In some alternative embodiments, the semiconductor device 100a is picked and placed on the dielectric layer DI before the formation of the conductive through insulator vias TIV.

Figure 7:
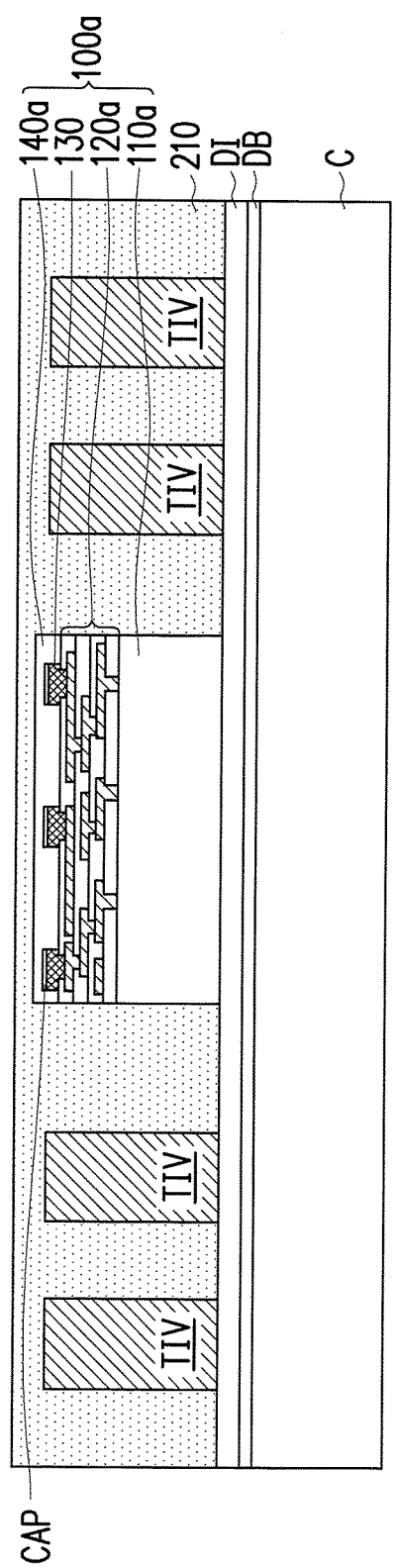

Referring to FIG. 7, an insulating encapsulation 210 is formed on the dielectric layer DI to cover the semiconductor device 100a and the conductive through insulator vias TIV. In some embodiments, the insulating encapsulation 210 is a molding compound formed by a molding process (e.g., a compression molding process). The conductive pillars 130 and the protection layer 140a of the semiconductor device 100a are covered by the insulating encapsulation 210. In other words, the conductive pillars 130 and the protection layer 140a of the semiconductor device 100a are not revealed and are protected by the insulating encapsulation 210. In some embodiments, the insulating encapsulation 210 includes epoxy or other suitable dielectric materials.

Referring to FIG. 7 and FIG. 8, the insulating encapsulation 210 is then grinded until the top surfaces of the conductive vis 130 and the top surface of the protection layer 140a are exposed. In some embodiments, the insulating encapsulation 210 is grinded by a mechanical grinding process and/or a chemical mechanical polishing (CMP) process. After the insulating encapsulation 210 is grinded, an insulating encapsulation 210' is formed over the dielectric layer DI. During the grinding process of the insulating encapsulation 210, parts of the protection layer 140a, the conductive caps CAP, and parts of the conductive pillars 130 are grinded until the top surfaces of the conductive pillars 130 are exposed. Since the conductive caps CAP are grinded, the probing marks formed on the top surfaces of the conductive caps CAP may not deteriorate the reliability of the conductive pillars 130 and the semiconductor device 100a. After grinding process of the insulating encapsulation 210 is performed, a grinded protection layer 140a' are formed. In some embodiments, during the grinding process of the insulating encapsulation 210, parts of the conductive through insulator vias TIV are grinded also.

As shown in FIG. 8, the insulating encapsulation 210' encapsulates the sidewalls of the semiconductor device 100a, and the insulating encapsulation 210' is penetrated by the conductive through insulator vias TIV. In other words, the semiconductor device 100a and the conductive through insulator vias TIV are embedded in the insulating encapsulation 210'. It is noted that the top surfaces of the conductive through insulator vias TIV, the top surface of the insulating encapsulation 210', and the top surfaces of the conductive pillars 130 are substantially coplanar with the top surface of the protection layer 140a'.

Figure 9:
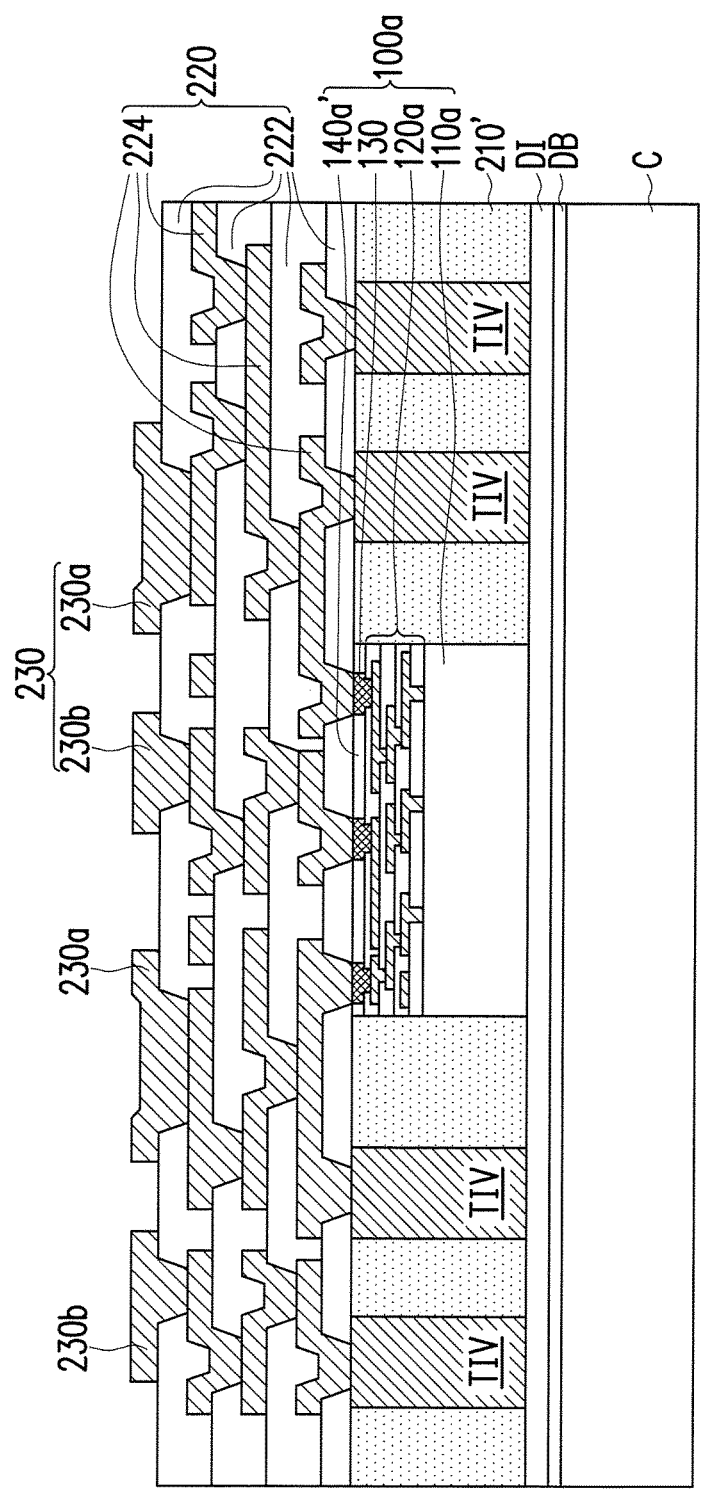

Referring to FIG. 9, after the insulating encapsulation 210' and the protection layer 140a' are formed, a redistribution circuit structure 220 electrically connected to the conductive pillars 130 of the semiconductor device 100a is formed on the top surfaces of the conductive through insulator vias TIV, the top surface of the insulating encapsulation 210', the top surfaces of the conductive pillars 130, and the top surface of the protection layer 140a'. Since the redistribution circuit structure 220 is fabricated over the semiconductor device 100a and the insulating encapsulation 210', the redistribution circuit structure 220 is a so-called front side redistribution circuit structure. The redistribution circuit structure 220 is described in accompany with FIG. 9 in detail.

As shown in FIG. 9, the redistribution circuit structure 220 includes a plurality of dielectric layers 222 and a plurality of redistribution conductive layers 224 stacked alternately. In some embodiments, the top surfaces of the conductive pillars 130 and the top surfaces of the conductive through insulator vias TIV are in contact with the redistribution circuit structure 220. The top surfaces of the conductive pillars 130 and the top surfaces of the conductive through insulator vias TIV are partially covered by the bottommost dielectric layer 222.

Referring to FIG. 9, after the redistribution circuit structure 220 is formed, a plurality of pads 230 are then formed on the topmost redistribution conductive layer 224 of the redistribution circuit structure 220. The pads 230 include a plurality of under-ball metallurgy (UBM) patterns 230a for ball mount and a plurality of connection pads 230b for mounting of passive components. The pads 230 are electrically connected to the topmost redistribution conductive layer 224 of the redistribution circuit structure 220. In other words, the pads 230 are electrically connected to the conductive pillars 130 of the semiconductor device 100a and the conductive through insulator pillars TIV through the redistribution circuit structure 220. It is noted that the number of the UBM patterns 230a and the connection pads 230b is not limited in this disclosure.

Figure 10:
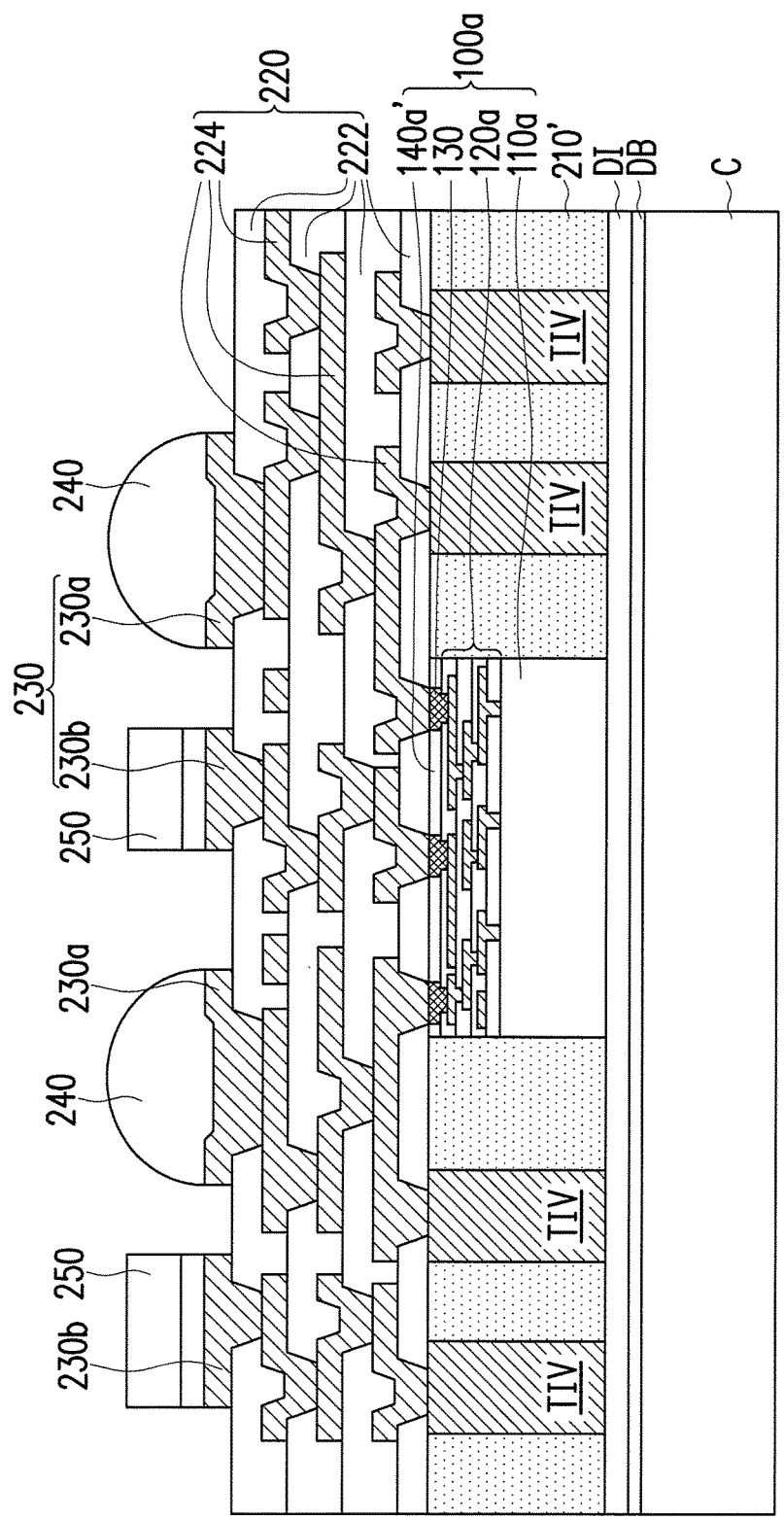

Referring to FIG. 10, after the UBM patterns 230a and the connection pads 230b are formed, a plurality of conductive balls 240 are placed on the under-ball metallurgy patterns 230a, and a plurality of passive components 250 are mounted on the connection pads 230b. In some embodiments, the conductive balls 240 may be placed on the under-ball metallurgy patterns 230a by a ball placement process, and the passive components 250 may be mounted on the connection pads 230b through a solder or reflow process. In some embodiments, the height of the conductive balls 240 is greater than the height of the passive components 250, for example. It is noted that, after the passive components 250 are mounted on the connection pads 230b, the interfaces between the topmost patterned conductive layer 124 (e.g. copper layer) and the Ti/Cu seed patterns 134 may induce less equivalent series inductance (ESL) and/or equivalent series resistance (ESR).

Figure 11:
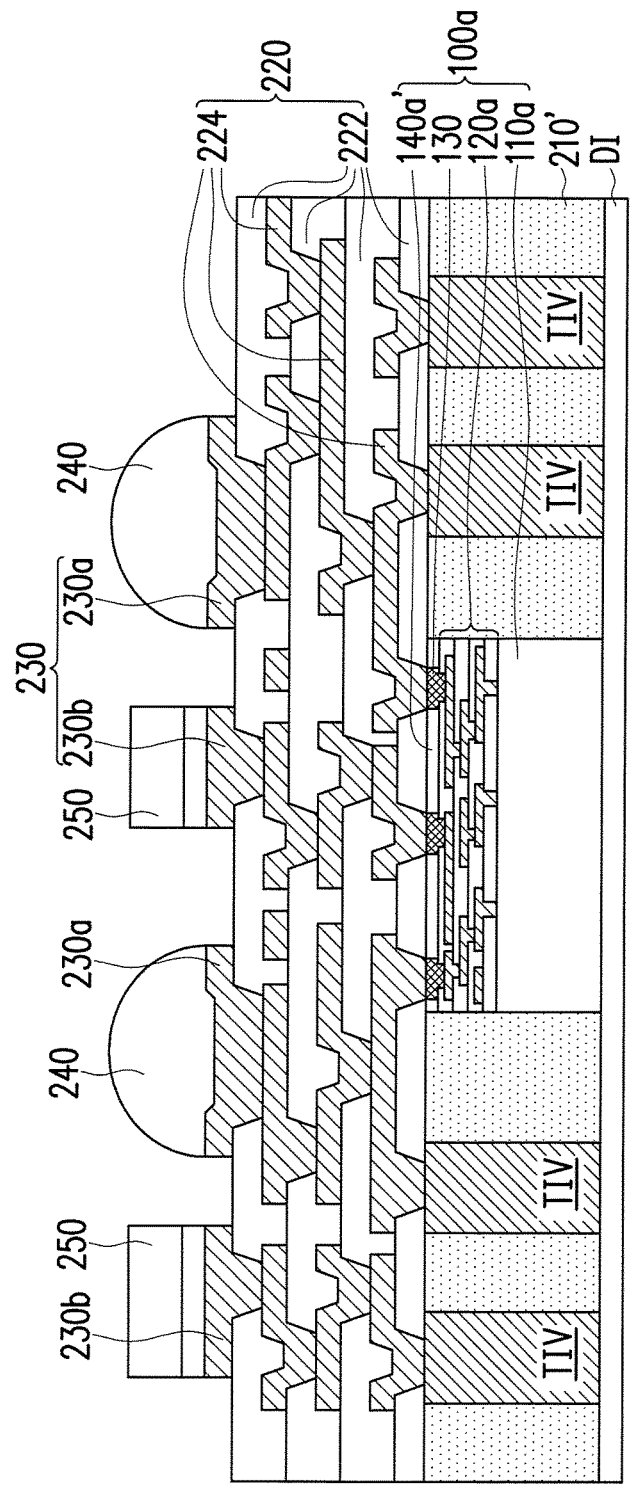

Referring to FIG. 10 and FIG. 11, after the conductive balls 240 and the passive components 250 are mounted on the pads 230, the dielectric layer DI formed on the bottom surface of the insulating encapsulation 210' is de-bonded from the de-bonding layer DB such the dielectric layer DI is separated from the carrier C. In some embodiments, the de-bonding layer DB (e.g., the LTHC release layer) may be irradiated by an UV laser such that the dielectric layer DI is peeled from the carrier C.

Figure 12:
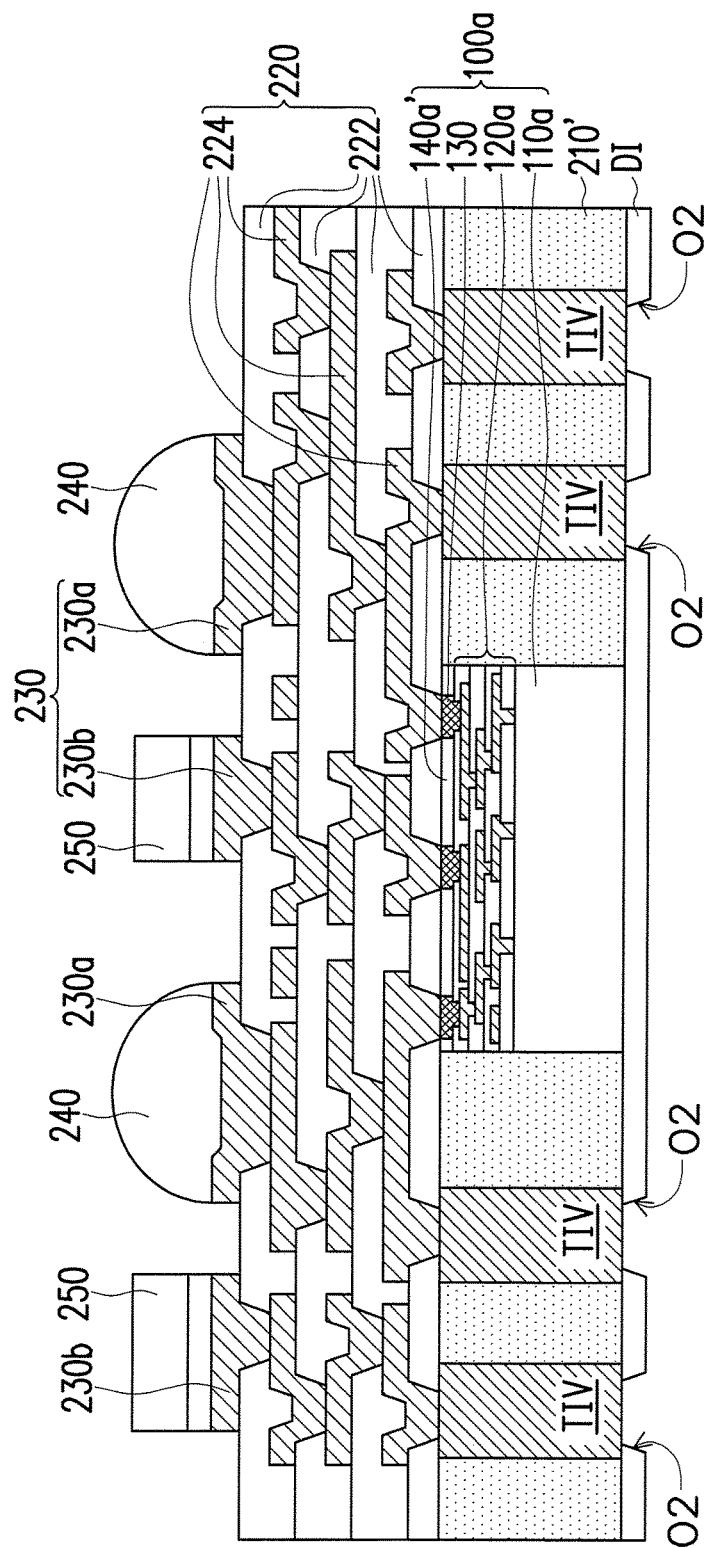

As shown in FIG. 12, the dielectric layer DI is then patterned such that a plurality of contact openings O2 are formed to expose the bottom surfaces of the conductive through insulator vias TIV. The number and position of the contact openings O2 are corresponding to the number of the conductive through insulator vias TIV. In some embodiments, the contact openings O2 of the dielectric layer DI are formed by a laser drilling process or other suitable patterning processes. In some alternative embodiments, the dielectric layer DI may be entirely removed from the bottom surface of the insulating encapsulation 210' so as to expose the bottom surfaces of the conductive through insulator vias TIV.

Figure 13:
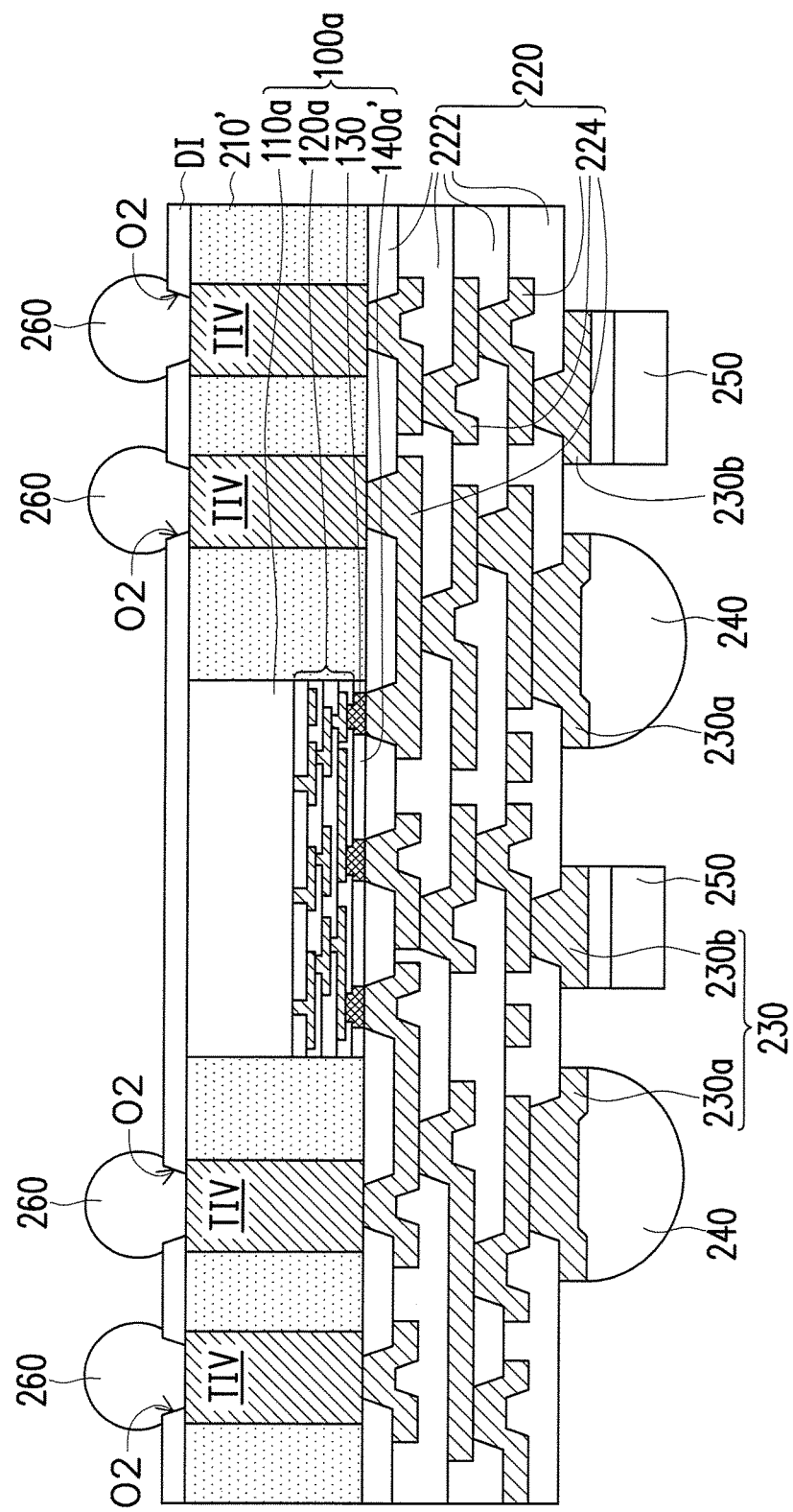

Referring to FIG. 13, after the contact openings O2 are formed in the dielectric layer DI, a plurality of conductive balls 260 are placed on the bottom surfaces of the conductive through insulator vias TIV that are exposed by the contact openings O2. And, the conductive balls 260 are, for example, reflowed to bond with the bottom surfaces of the conductive through insulator vias TIV. As shown in FIG. 13, after the conductive balls 230 and the conductive balls 260 are formed, an integrated fan-out package of the integrated circuit 100 having dual-side terminal design (i.e. the conductive balls 240 and 260) is accomplished.

Figure 14:
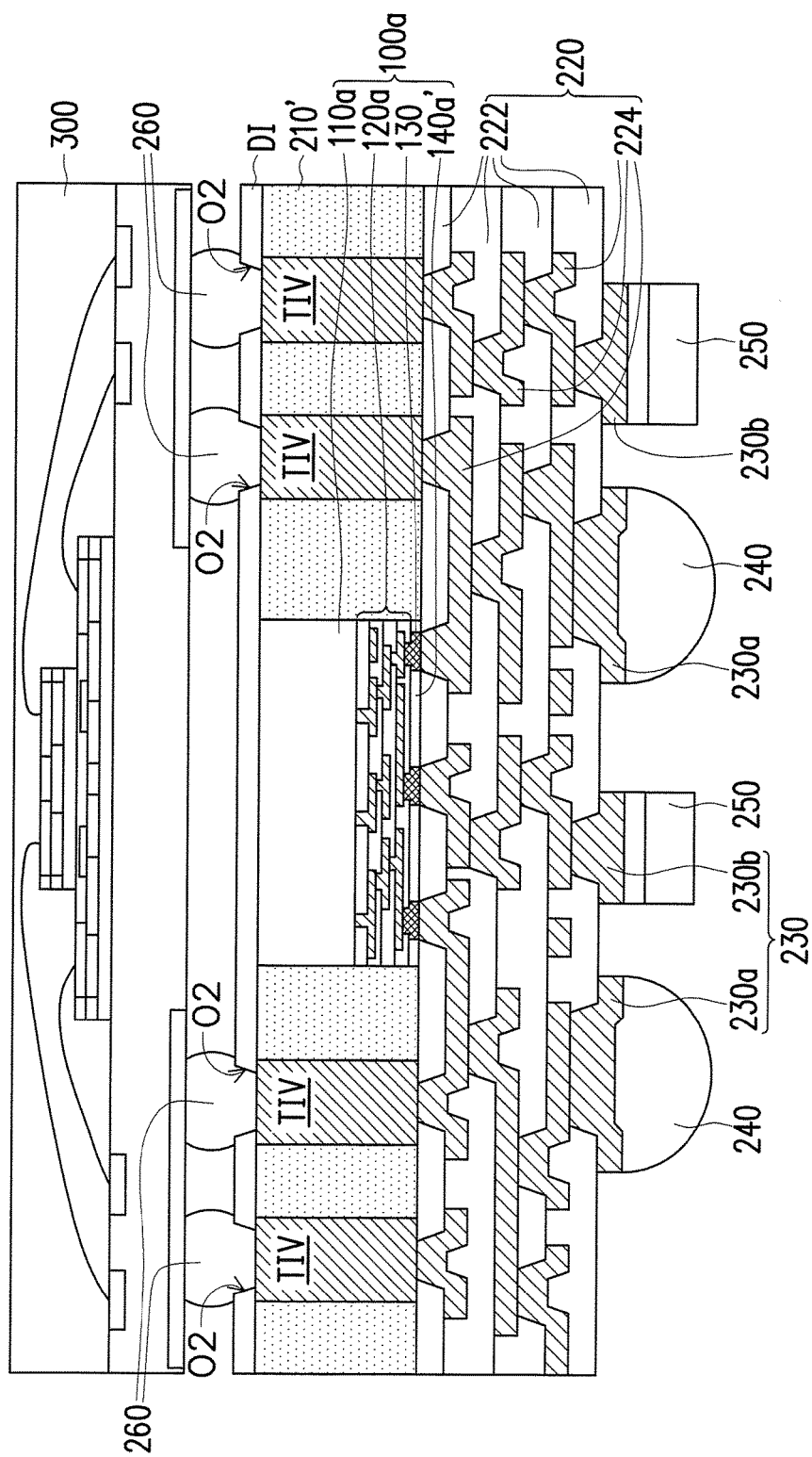
FIG. 14 is a cross-sectional view illustrating a package-on-package (POP) structure in accordance with some embodiments of the present disclosure.

FIG. 14 is a cross-sectional view illustrating a package-on-package (POP) structure in accordance with some embodiments of the present disclosure. Referring to FIG. 14, another package 300 is then provided. The package 300 is, for example, a memory device or other suitable semiconductor devices. The package 300 is stacked over and is electrically connected to the integrated fan-out package illustrated in FIG. 13 through the conductive balls 260 such that a package-on-package (POP) structure is fabricated.

Figure 26:
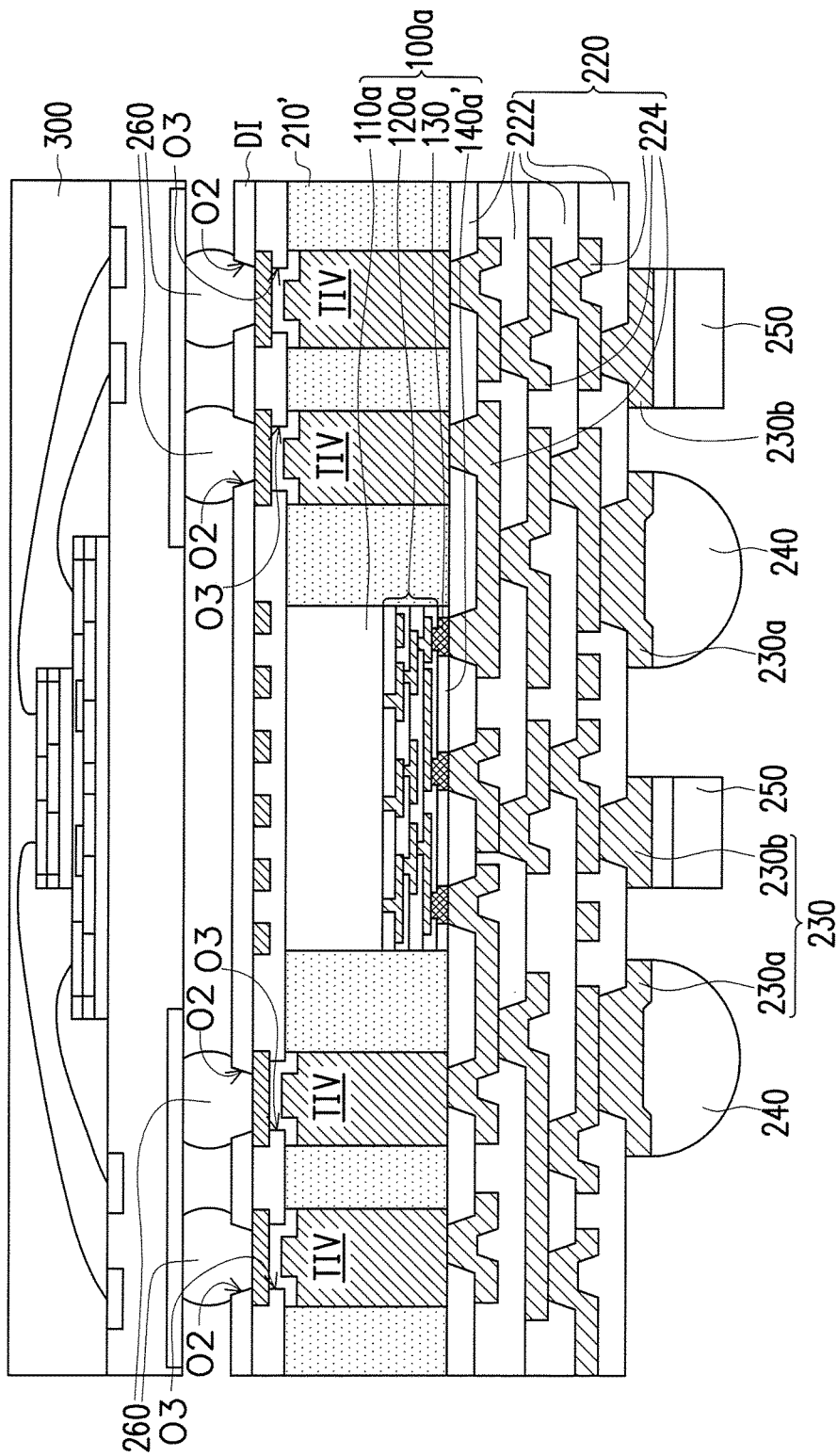
FIG. 26 is a cross-sectional view illustrating a package-on-package (POP) structure in accordance with some alternative embodiments of the present disclosure.

FIG. 15 through FIG. 25 schematically illustrate a process flow for fabricating an integrated fan-out package in accordance with some alternative embodiments of the present disclosure; and FIG. 26 is a cross-sectional view illustrating a package-on-package (POP) structure in accordance with some alternative embodiments of the present disclosure.

Figure 15:
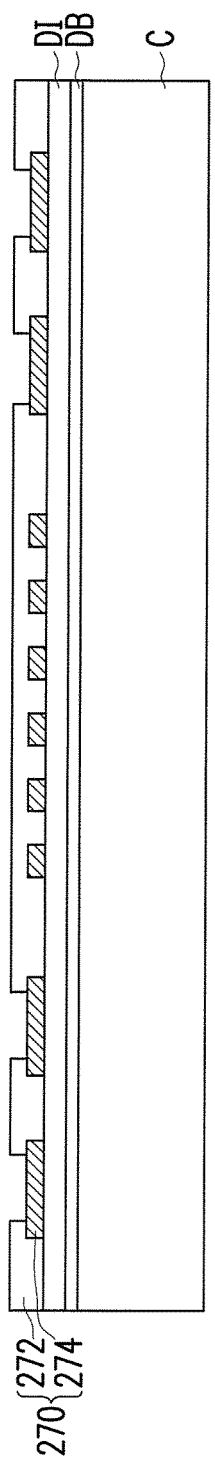
FIG. 15 through FIG. 25 schematically illustrate a process flow for fabricating an integrated fan-out package in accordance with some alternative embodiments of the present disclosure.

Referring to FIG. 15, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example. In alternative embodiments, the de-bonding layer DB may be a photo-curable release film whose stickiness is decreased by a photo-curing process or a thermal curable release film whose stickiness is decreased by a thermal-curing process, and the first dielectric layer DI may be made of other photosensitive or non-photosensitive dielectric materials. After the carrier C having the de-bonding layer DB and the dielectric layer DI formed thereon is provided, a back side redistribution circuit structure 270 is formed on the carrier C. The back side redistribution circuit structure 270 includes at least one dielectric layer 272 and at least one redistribution conductive layer 274. The at least one dielectric layer 272 covers the at least one redistribution conductive layer 274, and the at least one dielectric layer 272 includes a plurality of opening O3 for exposing the redistribution conductive layer 274 underneath.

Figure 16:
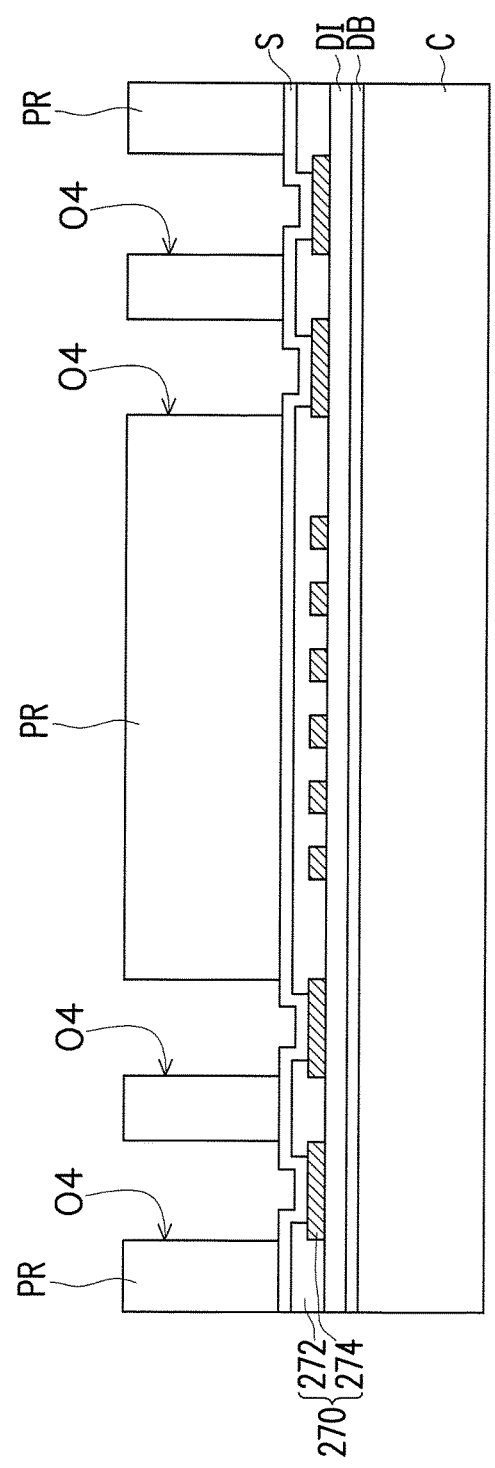

Referring to FIG. 16, after the back side redistribution circuit structure 270 is formed on the carrier C, a seed layer S is formed on the back side redistribution circuit structure 270. In some embodiments, the seed layer S may be a sputtered Ti/Cu seed layer formed on the back side redistribution circuit structure 270.

As shown in FIG. 16, a patterned photoresist PR including a plurality of openings O4 is formed on the seed layer S. The position and the number of the openings O4 in the patterned photoresist PR are corresponding to the openings O3 of the dielectric layer 272. Furthermore, the seed layer S is partially exposed by the openings O4 in the patterned photoresist PR.

Figure 17:
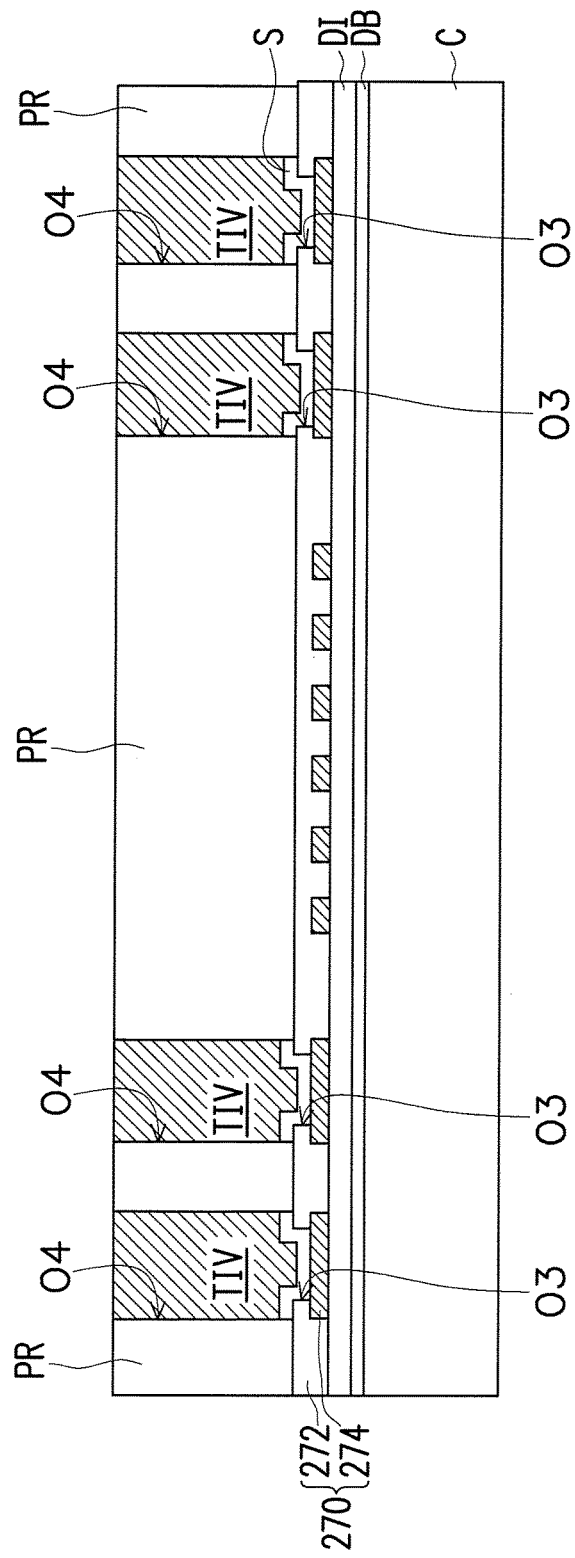

Referring to FIG. 17, the carrier C having back side redistribution circuit structure 270, the seed layer S and the patterned photoresist PR thereon is immersed into a plating bath such that a plurality of conductive through insulator vias TIV are formed in the openings O4. The conductive through insulator vias TIV partially covers on the seed layer S.

Figure 18:
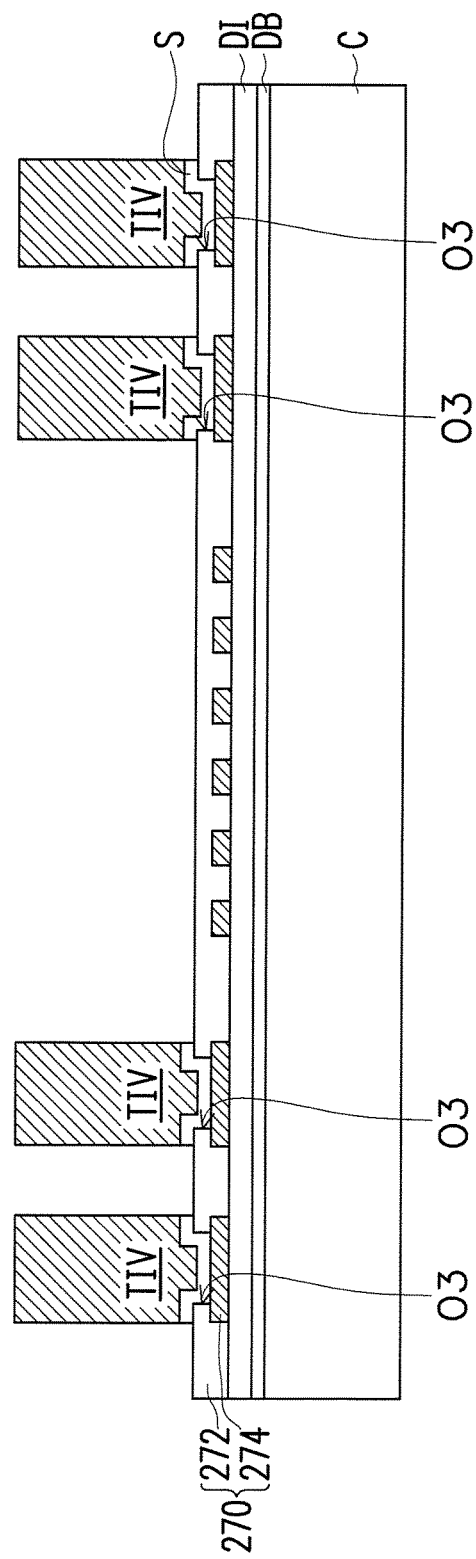

Referring to FIG. 18, after the conductive through insulator vias TIV are formed onto the exposed seed layer S through plating, the patterned photoresist PR is removed. Thereafter, the seed layer S is patterned by using the conductive through insulator vias TIV as a hard mask. In some embodiments, the conductive through insulator vias TIV may be copper posts or other suitable metallic posts.

Figure 19:
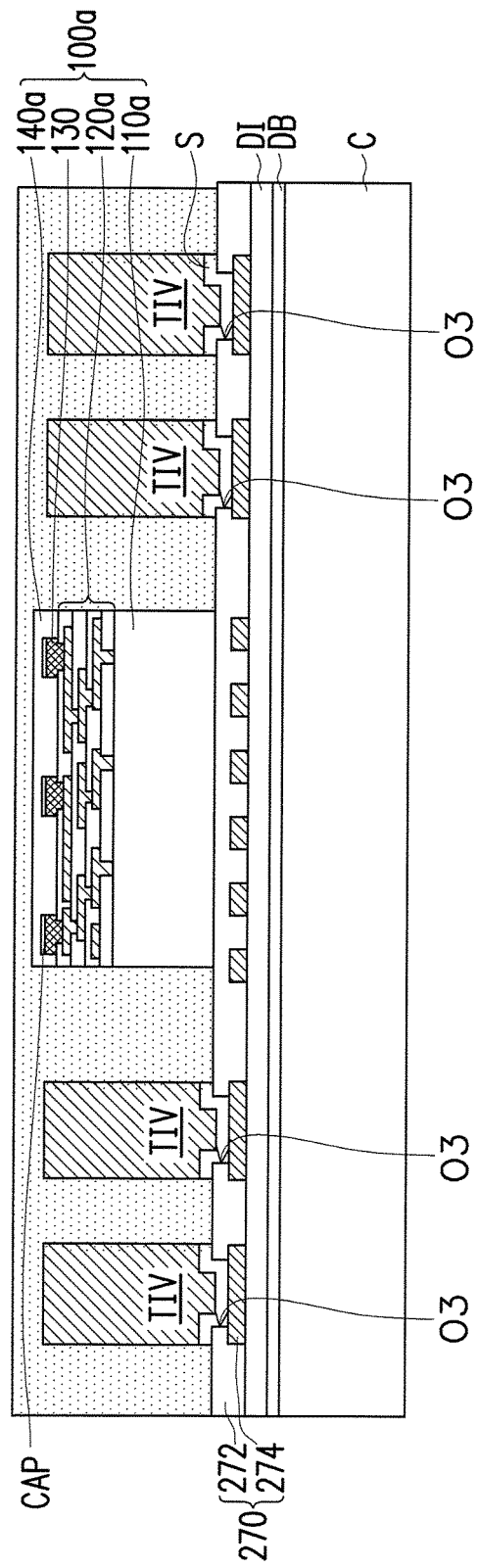
Figure 20:
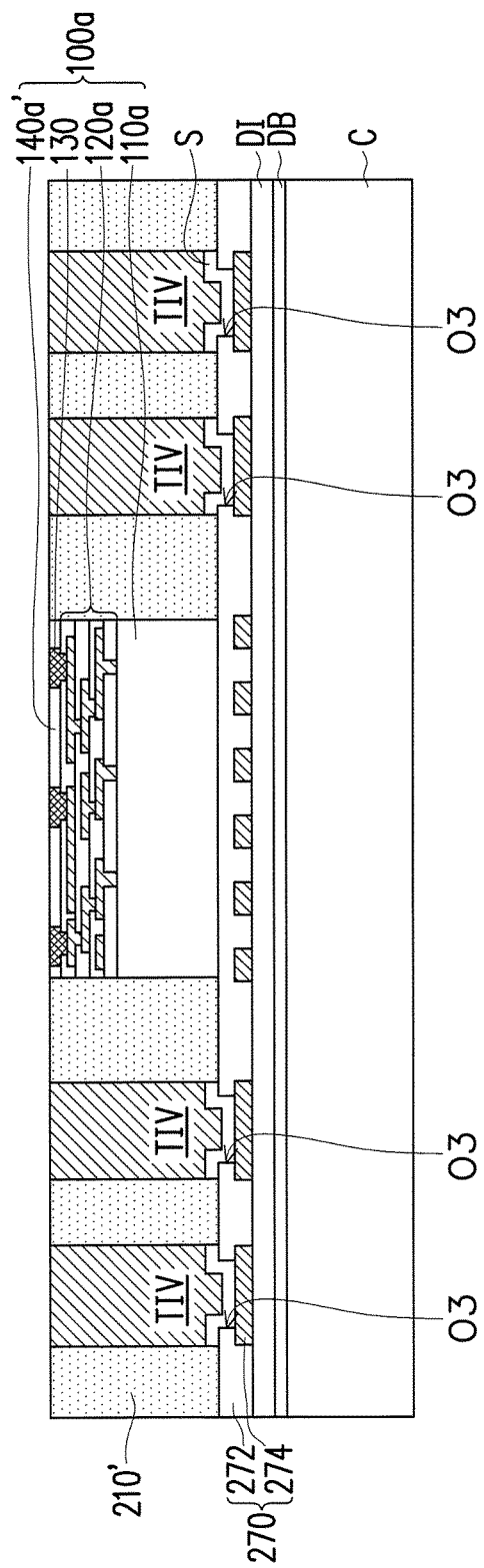
Figure 21:
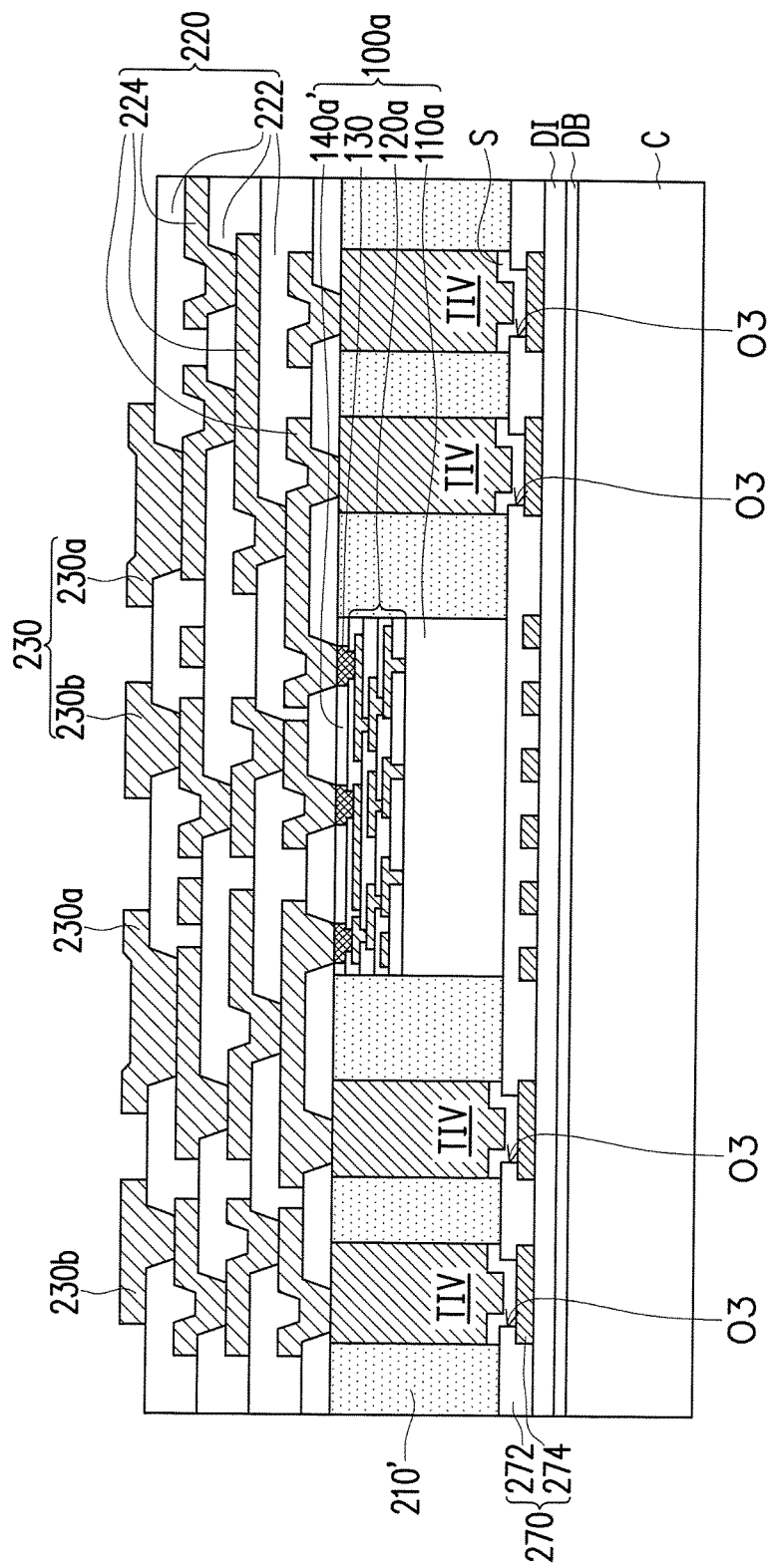
Figure 22:
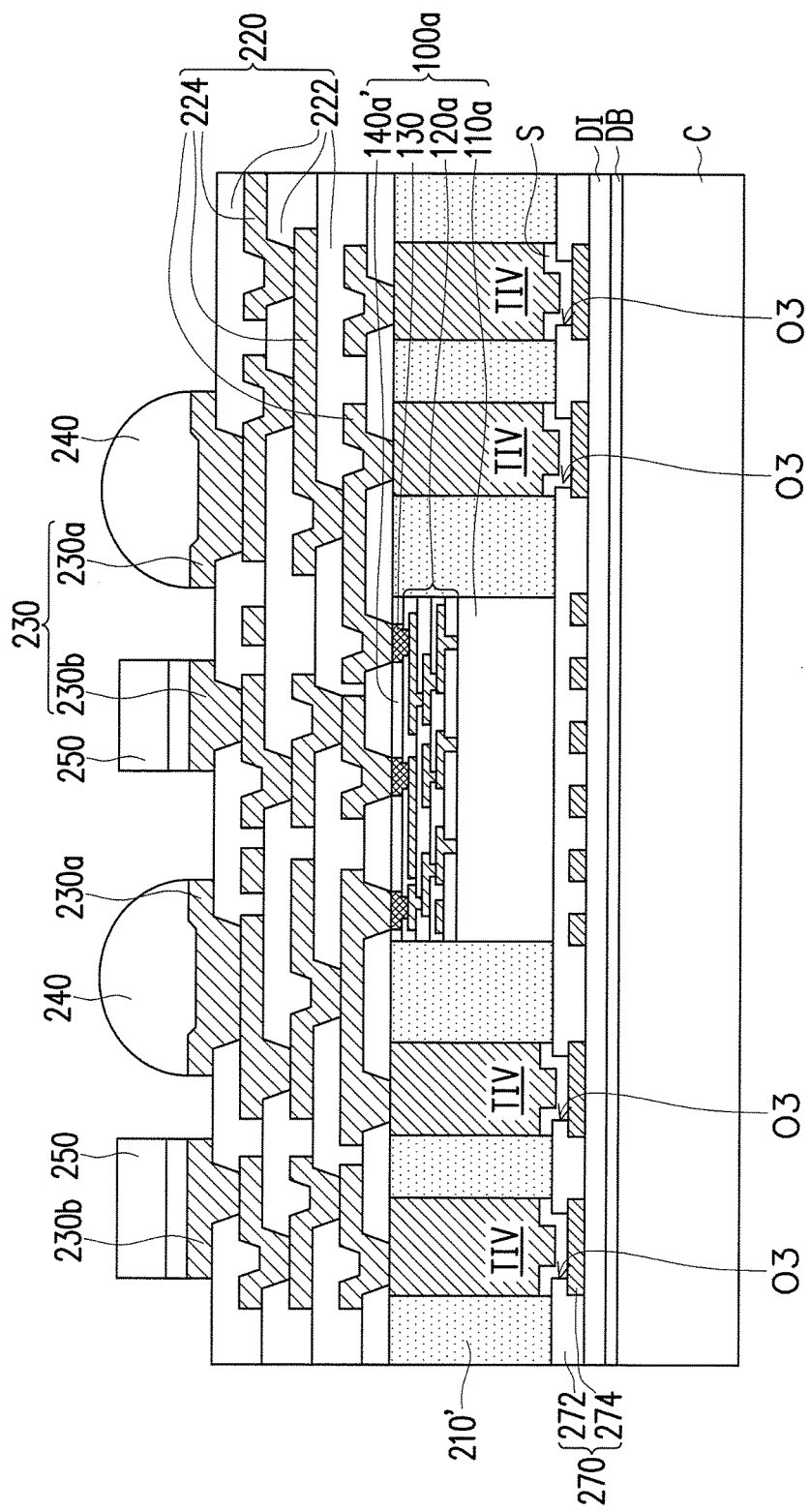
Figure 23:
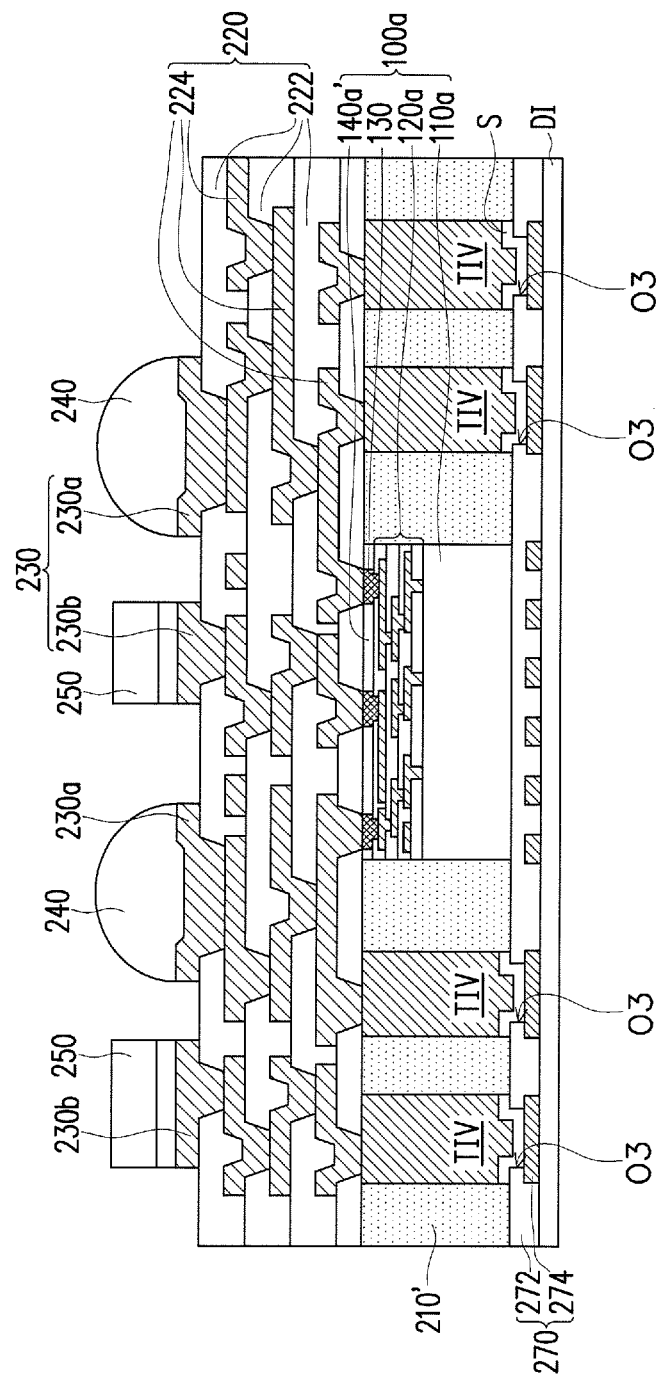

Referring to FIG. 5 and FIG. 19, in some embodiments, at least one of the singulated semiconductor device 100a (shown in FIG. 5) including the conductive pillars 130 distributed thereon is picked and placed on the back side redistribution circuit structure 270. The semiconductor device 100a is attached or adhered on the back side redistribution circuit structure 270 through a die attachment film (DAF), an adhesion paste or the like. In some alternative embodiments, two or more semiconductor devices 100a are picked and placed on the back side redistribution circuit structure 270, and the semiconductor devices 100a placed on the back side redistribution circuit structure 270 may be arranged in an array. When the semiconductor devices 100a placed on the dielectric layer DI are arranged in an array, the conductive through insulator vias TIV may be classified into groups, and each of the semiconductor devices 100a is corresponding to and is surrounded by one group of the through insulator vias TIV, respectively. The number of the semiconductor devices 100a is corresponding to the number of the groups of the conductive through insulator vias TIV.

Referring to FIG. 20 through FIG. 26, the process flow for fabricating an integrated fan-out package is similar with that illustrated in FIG. 8 through FIG. 14 except that the insulating encapsulations 210 and 210' are formed over the back side redistribution circuit structure 270, and the front side redistribution circuit structure 220 is electrically connected to the back side redistribution circuit structure 270 through the through insulator vias TIV. In other words, the semiconductor device 100a is electrically connected to the back side redistribution circuit structure 270 through the front side redistribution circuit structure 220 and the through insulator vias TIV. The detailed descriptions of FIG. 20 through FIG. 26 are thus omitted.

In the above-mentioned embodiments, the fabrication costs and thermal budge of the semiconductor devices and the integrated fan-out package are lowered. Furthermore, the throughput of the semiconductor devices and the integrated fan-out package is improved.

According to some embodiments, a method for fabricating semiconductor devices including the following steps is provided. A wafer including a plurality of integrated circuits arranged in an array is provided, wherein the wafer includes a semiconductor substrate and an interconnection structure covering the semiconductor substrate, the interconnection structure includes a plurality of patterned conductive layers and a plurality of inter-dielectric layers stacked alternately, the topmost patterned conductive layer of the patterned conductive layers is covered by the topmost inter-dielectric layer of the inter-dielectric layers, and the topmost patterned conductive layer is exposed by a plurality of openings of the topmost inter-dielectric layer. A plurality of conductive pillars are formed on the topmost patterned conductive layer exposed by the openings. A chip-probing process is performed to inspect the conductive pillars. A protection layer is formed on the wafer to cover the conductive pillars. A wafer sawing process is performed to form the semiconductor devices.

According to some alternative embodiments, a method for fabricating integrated fan-out packages including the following steps is provided. A wafer including a plurality of integrated circuits arranged in an array is provided, wherein the wafer includes a semiconductor substrate and an interconnection structure covering the semiconductor substrate, the interconnection structure includes a plurality of patterned conductive layers and a plurality of inter-dielectric layers stacked alternately, the topmost patterned conductive layer of the patterned conductive layers is covered by the topmost inter-dielectric layer of the inter-dielectric layers, and the topmost patterned conductive layer is exposed by a plurality of openings of the topmost inter-dielectric layer. A plurality of conductive pillars is formed on the topmost patterned conductive layer exposed by the openings. A chip-probing process is performed to inspect the conductive pillars. A protection layer is formed on the wafer to cover the conductive pillars. A wafer sawing process is performed to form the semiconductor devices. The semiconductor devices are encapsulated with an insulating encapsulation. The insulating encapsulation and the semiconductor devices encapsulated by the insulating encapsulation are grinded until the conductive pillars are exposed. A first redistribution circuit structure is formed on the insulating encapsulation and the semiconductor devices encapsulated by the insulating encapsulation, and the first redistribution circuit structure is electrically connected to the semiconductor devices encapsulated by the insulating encapsulation.

According to some alternative embodiments, a semiconductor device including an integrated circuit, a plurality of conductive pillars, and a protection layer is provided. The integrated circuit includes a semiconductor substrate and an interconnection structure covering the semiconductor substrate, wherein the interconnection structure includes a plurality of patterned conductive layers and a plurality of inter-dielectric layers stacked alternately, the topmost patterned conductive layer of the patterned conductive layers is covered by the topmost inter-dielectric layer of the inter-dielectric layers, and the topmost patterned conductive layer is exposed by a plurality of openings of the topmost inter-dielectric layer. The conductive pillars are disposed on the topmost patterned conductive layer exposed by the openings, and the conductive pillars are electrically connected to the topmost patterned conductive layer through the openings. The protection layer covers the integrated circuit and the conductive pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating semiconductor devices, comprising:
    providing a wafer comprising a plurality of integrated circuits arranged in an array, the wafer comprising a semiconductor substrate and an interconnection structure covering the semiconductor substrate, the interconnection structure comprising a plurality of patterned conductive layers and a plurality of inter-dielectric layers stacked alternately, a topmost patterned conductive layer of the patterned conductive layers being covered by a topmost inter-dielectric layer of the inter-dielectric layers, and the topmost patterned conductive layer being exposed by a plurality of openings of the topmost inter-dielectric layer;
    forming a plurality of conductive pillars on the topmost patterned conductive layer exposed by the openings;
    performing a chip-probing process to inspect the conductive pillars;
    forming a plurality of conductive caps on top surfaces of the conductive pillars;
    forming a protection layer on the wafer to cover the conductive caps and the conductive pillars; and
    performing a wafer sawing process to form the semiconductor devices.

2. The method as claimed in claim 1, wherein the chip-probing process is performed on the conductive caps to inspect the conductive pillars.

3. The method as claimed in claim 1, wherein at least parts of the conductive pillars and the topmost patterned conductive layer are made of a same material.

4. The method as claimed in claim 1, wherein the chip-probing process is performed once before forming the protection layer on the wafer.

5. A method for fabricating integrated fan-out packages, comprising:
    providing a wafer comprising a plurality of integrated circuits arranged in an array, the wafer comprising a semiconductor substrate and an interconnection structure covering the semiconductor substrate, the interconnection structure comprising a plurality of patterned conductive layers and a plurality of inter-dielectric layers stacked alternately, a topmost patterned conductive layer of the patterned conductive layers being covered by a topmost inter-dielectric layer of the inter-dielectric layers, and the topmost patterned conductive layer being exposed by a plurality of openings of the topmost inter-dielectric layer;
    forming a plurality of conductive pillars on the topmost patterned conductive layer exposed by the openings;
    performing a chip-probing process on the conductive pillars;
    forming a plurality of conductive caps on top surfaces of the conductive pillars;
    forming a protection layer on the wafer to cover the conductive caps and the conductive pillars;
    performing a wafer sawing process to form the semiconductor devices;
    encapsulating the semiconductor devices with an insulating encapsulation;
    grinding the insulating encapsulation and the semiconductor devices encapsulated by the insulating encapsulation until the conductive pillars are exposed; and
    forming a first redistribution circuit structure on the insulating encapsulation and the semiconductor devices encapsulated by the insulating encapsulation, the first redistribution circuit structure being electrically connected to the semiconductor devices encapsulated by the insulating encapsulation.

6. The method as claimed in claim 5, wherein the chip-probing process is performed on the conductive caps to inspect electrical characteristics of the conductive pillars.

7. The method as claimed in claim 5, wherein the protection layer and the conductive caps are grinded until the conductive pillars are exposed.

8. The method as claimed in claim 5, wherein at least parts of the conductive pillars and the topmost patterned conductive layer are made of a same material.

9. The method as claimed in claim 5, wherein the chip-probing process is performed once before forming the protection layer on the wafer.

10. The method as claimed in claim 5, wherein encapsulating the semiconductor devices with the insulating encapsulation comprises:
   mounting the semiconductor devices onto a carrier; and
   forming the insulating encapsulation on the carrier to encapsulate the semiconductor devices mounted on the carrier.

11. The method as claimed in claim 5, wherein encapsulating the semiconductor devices with the insulating encapsulation comprises:
   providing a carrier having a de-bonding layer thereon;
   mounting the semiconductor devices onto the de-bonding layer; and
   forming the insulating encapsulation on the de-bonding layer to encapsulate the semiconductor devices mounted on the de-bonding layer.

12. The method as claimed in claim 5, wherein encapsulating the semiconductor devices with the insulating encapsulation comprises:
   forming a second redistribution circuit structure on a carrier;
   forming a plurality of through insulator vias on the second redistribution circuit structure;
   mounting the semiconductor devices onto the second redistribution circuit structure; and
   forming the insulating encapsulation on the second redistribution circuit structure to encapsulate the through insulator vias and the semiconductor devices mounted on the second redistribution structure.

13. The method as claimed in claim 12, wherein the through insulator vias are formed on the second redistribution circuit structure through plating.

14. A semiconductor device, comprising:
   an integrated circuit comprising a semiconductor substrate and an interconnection structure covering the semiconductor substrate, the interconnection structure comprising a plurality of patterned conductive layers and a plurality of inter-dielectric layers stacked alternately, a topmost patterned conductive layer of the patterned conductive layers being covered by a topmost inter-dielectric layer of the inter-dielectric layers, and the topmost patterned conductive layer being exposed by a plurality of openings of the topmost inter-dielectric layer;
   a plurality of conductive pillars disposed on the topmost patterned conductive layer exposed by the openings, the conductive pillars being electrically connected to the topmost patterned conductive layer through the openings;
   a protection layer covering the die and the conductive pillars; and
   a plurality of conductive caps covering top surfaces of the conductive pillars, wherein the conductive caps and the conductive pillars are covered by the protection layer.

15. The semiconductor device as claimed in claim 14, wherein the conductive caps comprises solder caps.

16. The semiconductor device as claimed in claim 14, wherein each of the conductive pillars comprises:
   a pillar portion; and
   a seed pattern between the pillar portion and the topmost patterned conductive layer, the seed pattern being in contact with the pillar portion and the topmost patterned conductive layer.

17. The semiconductor device as claimed in claim 16, wherein the pillar portions and the topmost patterned conductive layer are identical in material.

\* \* \* \* \*